United States Patent
Fuderer et al.

(10) Patent No.: US 6,268,729 B1
(45) Date of Patent: Jul. 31, 2001

(54) CORRECTION OF MAGNETIC RESONANCE SIGNALS IN A MAGNETIC RESONANCE IMAGING METHOD, AND A MAGNETIC RESONANCE DEVICE

(75) Inventors: Miha Fuderer; Cornelis L. G. Ham; Joost M. De Haan; Johannes H. Den Boef, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/137,373

(22) Filed: Aug. 20, 1998

(30) Foreign Application Priority Data

Aug. 28, 1997 (EP) .................................................. 97202642

(51) Int. Cl.$^7$ ..................................................... G01V 3/00
(52) U.S. Cl. ............................................................. 324/309
(58) Field of Search ..................................... 324/309, 307

(56) References Cited

U.S. PATENT DOCUMENTS

| | | | |
|---|---|---|---|
| 5,319,309 | * 6/1994 | den Boef et al. | 324/309 |
| 5,525,906 | 6/1996 | Crawford et al. | 324/322 |
| 5,933,540 | * 8/1999 | Lakshminarayanan et al. | 382/260 |

* cited by examiner

Primary Examiner—Christine Oda
Assistant Examiner—Dixomara Vargas
(74) Attorney, Agent, or Firm—John F. Vodopia

(57) ABSTRACT

The invention relates to a method and a device for the imaging of a part of an object which is arranged in a steady magnetic field. The method according to the invention includes a step for filtering the shot noise from the measured MR signals. Filtering is performed by determining in a first step the value of a combination of a value of a parameter of a measuring point of the MR signal to be corrected and values of the parameter of measuring points in a vicinity of the measuring point. If the value of this combination exceeds a predetermined reference, the value zero is assigned to the value to be corrected. The invention is based on the idea that for a substantial part of the k space the corresponding MR signals behave as white noise. The reference is determined from the statistical distribution of the white noise. If the value of the combination exceeds the reference, it is assumed that a measuring point has been affected by shot noise.

13 Claims, 2 Drawing Sheets

US 6,268,729 B1

CORRECTION OF MAGNETIC RESONANCE SIGNALS IN A MAGNETIC RESONANCE IMAGING METHOD, AND A MAGNETIC RESONANCE DEVICE

BACKGROUND OF THE INVENTION

1. Field of the Invention

The invention relates to a method of imaging an object by means of magnetic resonance (MR), which object is arranged in a substantially uniform, steady magnetic field, said method including the following steps:

measuring MR signals from the object by means of MR imaging pulse sequences, filtering the measured MR signals so as to suppress shot noise, a corrected value which is related to the measured MR signals being assigned to a measuring point of a measured MR signal to be corrected, and reconstructing an image from the filtered MR signals.

The invention also relates to an MR device for carrying out such a method.

2. Description of Related Art

A method of this kind is known from U.S. Pat. No. 5,525,906. In the context of the present patent application a k space is to be understood to mean a spatial frequency domain in which a path is followed during the measurement of the MR signals by application of gradients to the static magnetic field. The path in the k space is determined by the time integral of the gradients applied during the interval from the excitation of the nuclear spins until the instant in time at which the MR signal is measured. The measured values of the MR signals which correspond to the most important part of the path or paths produce the inverse Fourier transformed values of an image of the object. Furthermore, the term gradient is to be understood to mean temporary magnetic fields which are superposed on a steady magnetic field and cause a gradient in the steady magnetic field. MR imaging methods often utilize gradients in three respective orthogonal directions. Generally speaking, a gradient in the first direction is referred to as a read-out gradient, a gradient in the second direction as a phase encoding gradient, and a gradient in the third direction as a selection gradient. A measuring point is to be understood to mean a sampled value of the MR signal received at a sampling instant which corresponds to a position of the path in the k space.

The known method is used to suppress shot noise in the measured MR signals. In the context of the present patent application the term shot noise is to be understood to mean brief pulses which have a duration of, for example 1 microsecond or less, and a high amplitude relative to the measured MR signal. Such shot noise is caused, for example by electric discharges within the MR device or in the vicinity thereof, for example in the clothing of the staff attending the MR device. In the reconstructed MR image the shot noise present in the MR signal causes artefacts in the form of, for example a wavy pattern or a sum of wavy patterns which forms a fabric-like structure. According to the known method, a shot-noise affected value of the measuring point, which is to be corrected in relation to the measured MR signals, is replaced by the corrected value. To this end, according to the known method the energy content of a frequency band of the spectrum of the measured MR signals which is beyond the frequency band of the imaging information in the MR signal is determined. Subsequently, if the energy content exceeds a predetermined reference, the corrected value is assigned to the measuring point to be corrected. It is a drawback of this method that it is necessary to measure MR signals having a bandwidth which is larger than the bandwidth of the MR information which is to be expected on the basis of the MR imaging pulse sequence used.

SUMMARY OF THE INVENTION

It is an object of the invention to reduce the band width of the measured MR signals. To this end, the method according to the invention is characterized in that the filtering of the measured MR signals by means of the method also includes the following steps for determining the corrected value of the measuring point to be corrected:

determining a combination of a value of a parameter of the measuring point of the measured MR signal to be corrected and values of the parameter of measuring points in a vicinity of the measuring point to be corrected, and assigning the corrected value to the measuring point to be corrected if the combination exceeds a predetermined reference. The advantage of such a method resides in the fact that the bandwidth of the signals to be measured need not be greater than the frequency content of the MR signals which is to be expected on the basis of the MR imaging pulse sequence used, so that less expensive receivers can be used for the MR signals to be measured. The invention is based on the idea that a statistical distribution of MR signals corresponding to a large part of the k space can be first-order approximated by a Gaussian distribution of white noise. As a result, a measuring point to be corrected has very likely been influenced by the shot noise if said combination exceeds the predetermined reference. In that case, for example a value zero is assigned to the measuring point to be corrected. Even though this step introduces an error in the value of the measured MR signal, it has been found that the effect of this error in the image is less disturbing than the effect exerted on the image by shot noise in the MR signal.

A special version of the method according to the invention is characterized in that said combination is determined by the ratio of the value of the parameter of the measuring point to be corrected to a statistical magnitude of the values of the parameter of the measuring points in the vicinity. A statistical magnitude of the parameter of the measuring points in the vicinity is, for example the mean value of the parameter of measuring points in the vicinity. The number of measuring points present in the vicinity is determined by the Gaussian distribution of the white noise and the accepted risk of taking an incorrect decision. An incorrect decision is to be understood to mean a decision whereby the value of the measuring point to be corrected is unduly replaced by the corrected value. A statistical magnitude of the parameter is, for example the mean value of the values of the parameter of the measuring points in the vicinity of the image point to be corrected. On the basis of these choices, the risk P that the ratio K determined exceeds the predetermined reference $K_0$ is given by the formula:

$$P(K > K_0) = \left(1 + \frac{K_0}{M}\right)^{-M}. \tag{1}$$

in which M is the number of measuring points in the vicinity of the measuring point.

Another possibility consists in using, for example the maximum of the measuring points of the vicinity for the statistical magnitude.

A further version of the method according to the invention is characterized in that the measuring points in said vicinity are chosen so as to be symmetrically situated relative to the measuring point to be corrected. An advantage of the choice of a symmetrical distribution of the measuring points in the vicinity of the measuring point consists in that a statistical deviation in the statistical magnitude of the parameter of the measuring points in the vicinity is thus counteracted.

A further version of the invention is characterized in that the measuring points in said vicinity are chosen in such a manner that the measuring points correspond to positions in a dimension of a k space. The $k_x$ dimension is a suitable choice for this dimension in the k space. As a result of this choice, the method can be simply implemented in an electronic circuit or in a computer program.

A further version of the invention is characterized in that the corrected value of the measuring point to be corrected is determined by the value of an equivalent measuring point of a MR signal generated by a same an MR imaging pulse sequence. When an equivalent measuring point is not available the value of a measuring point to be corrected is determined again by a new measurement of an MR signal which is generated by repeating a similar MR imaging pulse sequence.

A further version of the invention is characterized in that the predetermined reference is chosen in relation to a distance from the origin of a position in the k space which corresponds to the measuring point to be corrected. Correction is thus made for the observation that an incorrect decision regarding a correction of a measuring point corresponding to a position near the origin of the k space causes a disturbance in the image which is larger than that caused by an incorrect decision regarding a correction of a measuring point corresponding to a position at some distance from the origin of the k space.

A further version of the invention is characterized in that a measuring point to be corrected is chosen in such a manner that a position in the k space which corresponds to the measuring point to be corrected is situated outside a center of the k space. The correction for measuring points to be corrected which correspond to positions at the center of the k space for the image reconstruction is thus deactivated. The reason for doing so is that the assumption that the statistical distribution of the measured MR signal will behave as the statistical distribution of white noise is no longer valid in this central zone.

A further version of the invention is characterized in that the measuring points in the vicinity are chosen in such a manner that a distance from substantially all measuring points in the vicinity to the measuring point to be corrected amounts to some measuring points. The bandwidth of the measured MR signal is inter alia determined by, for example a pulse response of a filter used in a processing unit of an MR device for the measurement of the MR signals. Due to the pulse response of the filter provided for filtering the MR signals a very brief pulse in time is spread across some measuring points around the measuring point to be corrected. When a vicinity is selected which contains only measuring points which are situated at a distance of at least some pixels from the pixel to be corrected, the effect of this filter is corrected.

The invention also relates to an MR device which is characterized in that in order to suppress shot noise in the measured MR signals the MR device also includes means for determining a combination of a value of a parameter of a measuring point of the measured MR signal to be corrected and values of the parameter of measuring points in a vicinity of the measuring point to be corrected, and for assigning a corrected value to the measuring point to be corrected if the combination exceeds a predetermined reference.

BRIEF DESCRIPTION OF THE DRAWING

The above and other, more detailed aspects of the invention will be described in detail hereinafter, by way of example, with reference to the drawing.

In the drawing.

DETAILED DESCRIPTION OF THE PREFERRED EMBODIMENT

Figure 1:
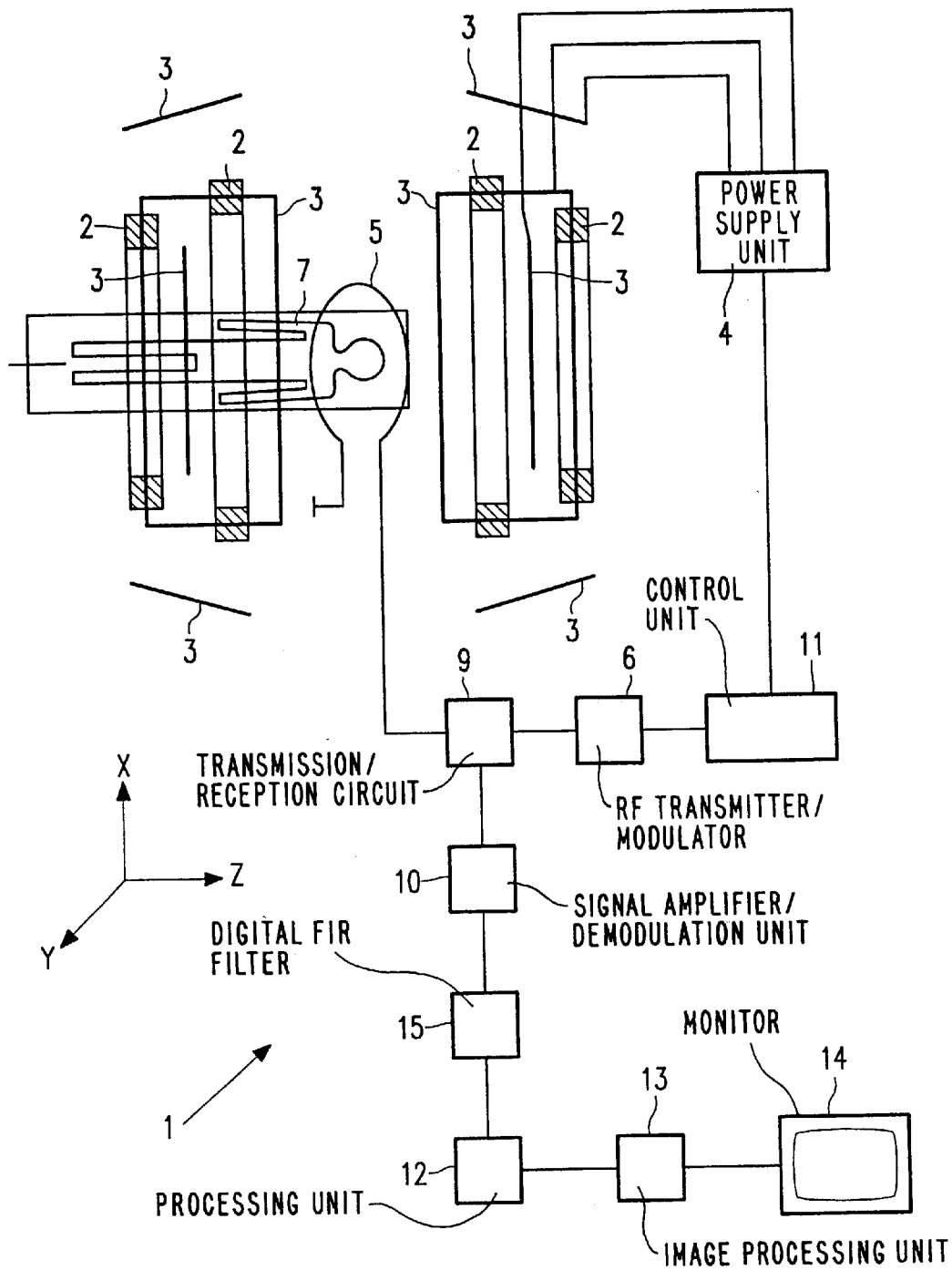
FIG. 1 shows a magnetic resonance imaging device.

FIG. 1 shows a magnetic resonance imaging device which includes a first magnet system 2 for generating a steady magnetic field and also various gradient coils 3 for generating additional magnetic fields having a gradient in the X, Y, Z directions. The gradient coils 3 are fed by the power supply unit 4. The MR imaging device also includes an RF transmitter coil 5. The RF transmitter coil 5 serves to generate RF magnetic fields and is connected to an RF transmitter and modulator 6. A receiving coil is used to receive the MR signal generated by the RF field in the object 7 to be examined. The object to be examined is, for example, a human or animal object. The receiving coil may be the same coil as the RF transmitter coil 5. The magnet system 2 also encloses an examination space which is large enough so as to accommodate a part of the body 7 to be examined. The RF transmitter coil 5 is arranged around or on a part of the body 7 within the examination space. The RF transmitter coil 5 is connected, via a transmission/reception circuit 9, to a signal amplifier and demodulation unit 10. The control unit 11 controls the RF transmitter and modulator 6 and the power supply unit 4 so as to generate special imaging pulse sequences which include RF pulses and gradients. The phase and amplitude derived from the demodulation unit 10 are applied, via a known digital FIR (Finite Impulse Response) filter 15, to a processing unit 12. The FIR filter 15 serves to limit the bandwidth of the measured and sampled MR signals. The processing unit 12 processes the signal values presented, for example by means of a two-dimensional Fourier transformation, so as to form an image. The image is visualized by means of an image processing unit 13, via a monitor 14. The Z direction of the co-ordinate system shown corresponds by convention to the direction of the static magnetic field in the magnet system 2. The measuring co-ordinate system x, y, z to be used can be chosen independently of the X, Y, Z system indicated in FIG. 1. In the present example a gradient in the x direction is referred to as a read-out gradient, a gradient in the y direction as a phase encoding gradient, and a gradient in the z direction as a selection gradient.

The invention will be described in detail hereinafter, by way of example, on the basis of a method in which a known Echo Planar Imaging (EPI) pulse sequence is used as the MR imaging pulse sequence. MR signals are measured by means of successive EPI pulse sequences and an image of the relevant part of the body is reconstructed from the measured MR signals, for example by means of a two-dimensional Fourier transformation. The EPI imaging pulse sequence is inter alia known from the document EP-A-604441. However, in addition to said EPI imaging pulse sequences, other known imaging pulse sequences can also be used, for example a Spin Echo (SE) imaging pulse sequence, a Rapid Acquisition and Relaxation Enhancement (RARE) imaging pulse sequence, and a Gradient and Spin Echo (GRASE) imaging pulse sequence. These imaging pulse sequences are also known from the previously cited EP-A-604441.

Figure 2:
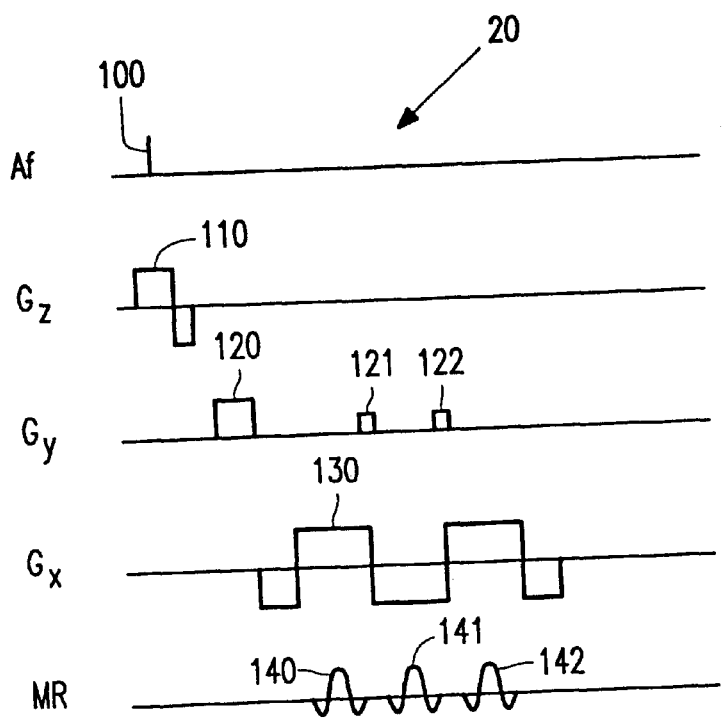
FIG. 2 shows an EPI pulse sequence.

FIG. 2 shows an EPI pulse sequence 20 which includes an excitation RF pulse and gradients. The EPI pulse sequence starts with the application of an excitation RF pulse 100 which has a flip angle a and a selection gradient 110 for excitation of the nuclear spins within a measuring zone, for example a measuring slice in the x, y plane through the body 7. The flip angle a amounts to, for example 90°. The selection gradient is oriented in the z direction. After the slice selection, an initial phase encoding gradient 120 and a read-out gradient 130 are applied. Further phase encoding gradients 121, 122, referred to as "blips", are applied after the second and further zero-crossings of the read-out gradient, enabling measurement of MR signals 140, 141, 142 whose sampling instants are situated on lines which are regularly distributed in the k space. The EPI pulse sequence 20 is repeated for different values of the initial phase encoding gradients $G_y$, so as to measure a complete set of MR signals which relate to, for example 128 or 256 lines in the k space. The values of the MR signals measured at the sampling instants are stored as a series of measuring points in the processing unit. The processing unit 12 subsequently reconstructs an image by means of an image processing unit 13; this image is displayed via the monitor 14.

Disturbances may occur, during the measurement of the MR signals, for example due to electric discharges in the MR device or due to electric discharges in the clothing of personnel attending the MR device. These disturbances cause shot noise in the measured MR signals. In order to suppress the shot noise in the measured MR signals, in a version of the invention there is determined a combination of a value of a parameter of the measuring point to be corrected and values of the parameter of the measuring points in the vicinity of the measuring point to be corrected. An example of said combination is the ratio K of the value of a parameter of a measuring point $m_i$ of the MR signals to be corrected to a statistical magnitude of the values of the parameter of the measuring points in the vicinity of the measuring point $m_i$. An example of the statistical magnitude is the mean value of said parameter of the measuring points in the vicinity. A parameter of the measuring point to be corrected is, for example an energy, defined as the square of a modulus of the value of the measuring point $m_i$ to be corrected; this can be written as a formula as $E=|I(m_i)|^2$. If said ratio K exceeds a predetermined reference $K_0$, a corrected value is assigned to the measuring point $m_i$ to be corrected, for example the value zero. Subsequently, these steps are repeated for substantially all measuring points of the MR signals. Another example of a value of a parameter of the measuring point $m_i$ to be corrected is, for example a weighted mean of the value of the parameter of the measuring point to be corrected and the values of the parameter of two neighboring measuring points $m_{i-1}$ and $m_{i+1}$, respectively.

Another possibility in respect of a statistical magnitude of the measuring points is, for example the maximum of the energy of the measuring points in the vicinity of the measuring point to be corrected.

In order to ensure that the image is not excessively influenced by the corrected values, measuring points which correspond to positions at a center of the k space are preferably excluded. The center of the k space is determined, for example as a zone around an origin of the k space, said zone extending across, for example 6 positions along the $k_x$ axis which correspond to 6 successive measuring points of the MR signals.

In order to determine the reference, use is made of the formula (1) which expresses the risk of an incorrect decision being taken and contains the number of measuring points present in the vicinity of the measuring point $m_i$ to be corrected. An incorrect decision is to be understood to mean a decision where a corrected value is unduly assigned to a measuring point. The reference $K_0$ is determined by the formula $$P(K > K_0) = \left(1 + \frac{K_0}{M}\right)^{-M} \tag{1}$$

in which P represents the probability that said ratio K of the energy of the measuring point to be corrected to the mean energy of the measuring points of the vicinity of the corrected measuring point exceeds the reference $K_0$, and M represents the number of measuring points in the vicinity of the measuring point $m_i$ to be corrected. An example of a vicinity used in practice is, for example a vicinity comprising 12 measuring points which correspond to 12 positions in one dimension in the k space, for example the $k_x$ axis. In the case of a vicinity comprising 12 measuring points and a probability of an incorrect decision of 1 to $10^7$, in conformity with the formula (1) the value of the reference $K_0$ amounts to 35.

Figure 3:
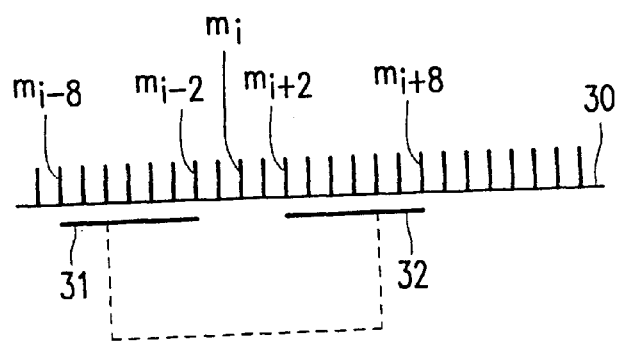
FIG. 3 shows a first vicinity of a measuring point of a measured MR signal.

For further enhancement of the reliability of the decision, the vicinity can be extended by means of measuring points which correspond to positions in other dimensions of the k space. An example in this respect is the $k_y$ axis and possibly the $k_z$ axis. FIG. 3 shows an example of a first vicinity of a measuring point $m_i$ of the MR signal.

FIG. 3 shows a number of, for example 12 measuring points of the first vicinity and the measuring point $m_i$ to be corrected on a first line 30. The 12 measuring points are chosen in such a manner that six successive measuring points $m_{i-8} \ldots m_{i-2}$ are situated to the left of the measuring point $m_i$, indicated by a first line segment 31, and six successive measuring points $m_{i+2} \ldots m_{i+8}$ are situated to the right of the measuring point $m_i$, indicated by a second line segment 32. In order to avoid that the value of the parameter of the measuring points in the vicinity of the measuring point $m_i$ to be corrected is influenced excessively in the measured MR signal by the FIR filter 15 present in the processing unit 12, the measuring points of the vicinity preferably are not selected to be contiguous with the measuring point $m_i$ to be corrected, but in such a manner that they are situated at a distance of a few measuring points from the measuring point $m_i$ to be corrected. This distance is dependent, for example on the length of the pulse response of the FIR filter 15 used which is expressed as a number of measuring points of the MR signal. In the example of FIG. 3 the minimum distance between the measuring point $m_i$ to be corrected and a measuring point of the vicinity amounts to two measuring points. In order to counteract a statistical error in said ratio K, the measuring points of the vicinity of the measuring point $m_i$ to be corrected are preferably symmetrically distributed relative to the measuring point $m_i$.

Figure 4:
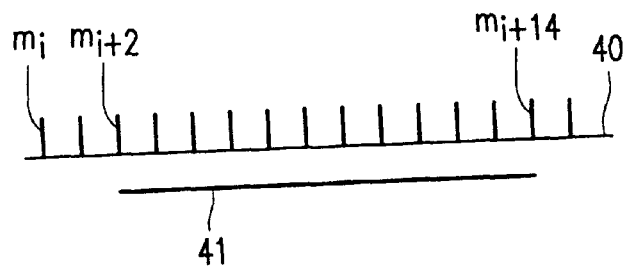
FIG. 4 shows a second vicinity of a measuring point of a measured MR signal.

FIG. 4 shows an example of a second, non-symmetrical vicinity. FIG. 4 shows 12 measuring points of the second vicinity and the measuring point $m_i$ to be corrected on a second line 40. The 12 measuring points are chosen in such a manner that, viewed in time, the 12 measuring points $m_{i+2} \ldots m_{i+14}$ are situated ahead of the measuring point $m_i$ to be corrected. The second vicinity in FIG. 4 is denoted by a third line segment 41. In order to avoid that the value of the parameter of the measuring points in the vicinity of the measuring point $m_i$ to be corrected is excessively influenced in the measured MR signal by the FIR filter 15 present in the processing unit 12, the measuring points $m_{i+2} \ldots m_{i+14}$ of the second vicinity are preferably chosen to be situated at a distance of two measuring points from the measuring point $m_i$ to be corrected. An advantage of this second vicinity consists in that a method utilizing the second vicinity can be readily implemented in an electronic circuit.

Another method of determining the corrected value of the measuring point $m_i$ consists in measuring a new MR signal by again generating an EPI imaging pulse sequence, the EPI imaging pulse sequence being generated in such a manner that the measured MR signal contains an equivalent measuring point which corresponds to a position in the k space which is the same as that whereto the measuring point $m_i$ corresponds. The corrected value of the measuring point $m_i$ is then determined by the value of the equivalent measuring point of a new measured MR signal formed by a new MR imaging pulse sequence to be generated.

According to the method of the invention, another parameter of the measuring point $m_i$ to be corrected, which can be determined instead of the energy, for example, is the modulus of the measuring point $m_i$ to be corrected. An advantage of the use of the amplitude consists in that the method can be implemented in an electronic circuit by utilizing analog filters.

What is claimed is:

1. A method of imaging an object by means of magnetic resonance (MR), which object is arranged in a substantially uniform, steady magnetic field, said method including the following steps:

measuring MR signals from the object by means of MR imaging pulse sequences, filtering the measured MR signals so as to correct particular MR signals if necessary, to suppress shot noise, said filtering including assigning a corrected value which is related to the measured MR signals to a measuring point of a measured MR signal to be corrected, and reconstructing an image from the filtered MR signals, characterized in that the filtering of the measured MR signals by means of the method also includes the following steps for determining the corrected value of the measuring point to be corrected:

determining a combination of a value of a parameter of the measuring point of the measured MR signal to be corrected and value of the parameter of measuring points in a vicinity of the measuring point to be corrected, and assigning the corrected value to the measuring point to be corrected if the combination exceeds a predetermined reference.

2. A method as claimed in claim 1, characterized in that said combination is determined by the ratio of the value of the parameter of the measuring point to be corrected to a statistical magnitude of the values of the parameter of the measuring points in the vicinity.

3. A method as claimed in claim 1, characterized in that the measuring points in said vicinity are chosen so as to be symmetrically situated relative to the measuring point to be corrected.

4. A method as claimed in claim 1, characterized in that the measuring points in said vicinity are chosen in such a manner that the measuring points correspond to positions along a dimension of a k space.

5. A method as claimed in claim 1, characterized in that the corrected value of the measuring point to be corrected is determined by the value of an equivalent measuring point of an MR signal generated by a same MR imaging pulse sequence.

6. A method as claimed in claim 1, characterized in that the predetermined reference is chosen in relation to a distance from the origin of a position in the k space which corresponds to the measuring point to be corrected.

7. A method as claimed in claim 1, characterized in that a measuring point to be corrected is chosen in such a manner that a position in the k space which corresponds to the measuring point to be corrected is situated outside a central zone of the k space.

8. A method as claimed in claim 1, characterized in that the measuring points in the vicinity are chosen in such a manner that the distance from substantially all measuring points in the vicinity to the measuring point to be corrected includes one or more other measuring points.

9. An MR device for imaging an object by means of magnetic resonance, which object is arranged in a steady state magnetic field, said device comprising:

means for sustaining the steady magnetic field, means for generating and measuring MR signals by means of MR imaging pulse sequences, means for filtering the measured MR signals to correct particular ones of such MR signals, where necessary to suppress shot noise content therein, a processing unit for reconstructing an MR image from the filtered MR signals, characterized in that in order to suppress shot noise in the measured MR signals, said means for filtering also comprises means for determining a combination of a value of a parameter of a measuring point of the measured MR signal to be corrected and values of the parameter of measuring points in a vicinity of the measuring point to be corrected, and for assigning a corrected value to the measuring point to be corrected if the combination exceeds a predetermined reference.

10. The method of claim 1 wherein the parameter of the measuring points is the energy of the values of the measuring point.

11. The method of claim 1 wherein the parameter of the measuring points is the modulus of the values of the measuring point.

12. The method of claim 2 wherein the statistical magnitude of the values of the parameter of the measuring points in the vicinity is the mean value of the values of the parameter of the measuring points in the vicinity.

13. The method of claim 2 wherein the statistical magnitude of the values of the parameter of the measuring points in the vicinity is the maximum value of the values of the parameter of the measuring points in the vicinity.

* * * * *